United States Patent
Saito et al.

(10) Patent No.: US 7,537,448 B2
(45) Date of Patent: May 26, 2009

(54) THERMAL PROCESSING METHOD AND THERMAL PROCESSING UNIT

(75) Inventors: Takanori Saito, Tokyo-To (JP); Kazuhide Serizawa, Tokyo-To (JP); Takashi Ichikawa, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 90 days.

(21) Appl. No.: 10/551,033

(22) PCT Filed: Mar. 29, 2004

(86) PCT No.: PCT/JP2004/004454

§ 371 (c)(1),
(2), (4) Date: Sep. 27, 2005

(87) PCT Pub. No.: WO2004/090959

PCT Pub. Date: Oct. 21, 2004

(65) Prior Publication Data

US 2007/0095288 A1    May 3, 2007

(30) Foreign Application Priority Data

Apr. 1, 2003   (JP)  .............................. 2003-097672

(51) Int. Cl.
*F27D 15/02* (2006.01)
(52) U.S. Cl. ........................... 432/81; 432/77; 432/247; 219/390
(58) Field of Classification Search ............ 432/77, 432/81, 82, 83, 4, 247, 253, 258; 219/390, 219/405; 118/724, 725
See application file for complete search history.

(56) References Cited

U.S. PATENT DOCUMENTS

| | | | | |
|---|---|---|---|---|
| 1,665,205 | A | * | 4/1928 | Getz ........................... 432/238 |
| 5,097,890 | A | | 3/1992 | Nakao |
| 5,314,541 | A | | 5/1994 | Saito et al. |
| 5,455,082 | A | | 10/1995 | Saito et al. |
| 5,481,088 | A | | 1/1996 | Peck et al. |
| 5,507,639 | A | * | 4/1996 | Monoe ......................... 432/77 |
| 6,238,208 | B1 | * | 5/2001 | Yoshida et al. ................. 432/2 |

(Continued)

FOREIGN PATENT DOCUMENTS

JP            57-027168         2/1982

(Continued)

OTHER PUBLICATIONS

Notification of Transmittal of Copies of Translation of the International Preliminary Report on Patentability (Form PCT/IB/338)—PCT/JP2004/004454, dated Jan. 2004.

(Continued)

*Primary Examiner*—Gregory A Wilson
(74) *Attorney, Agent, or Firm*—Smith, Gambrell & Russell, LLP

(57) ABSTRACT

The present invention is a thermal processing method including: a step of conducting a predetermined thermal process in a low temperature zone to a plurality of objects to be processed held in a tier-like manner by a heating unit, in a processing container that is made of metal and has the heating unit therein, and a step of introducing a cooling gas into respective areas in the processing container divided in a height direction of the objects to be processed.

10 Claims, 4 Drawing Sheets

U.S. PATENT DOCUMENTS

| | | | |
|---|---|---|---|
| 6,328,561 B1 * | 12/2001 | Hasper et al. | 432/238 |
| 6,402,508 B2 | 6/2002 | Harada et al. | |
| 6,403,927 B1 * | 6/2002 | Kato | 219/390 |
| 6,461,438 B1 | 10/2002 | Ookura et al. | |
| 6,534,750 B1 | 3/2003 | Tanoue et al. | |
| 6,727,474 B2 * | 4/2004 | Gat | 219/390 |
| 6,744,023 B2 * | 6/2004 | Garn et al. | 219/632 |
| 7,037,797 B1 | 5/2006 | Shooshtarian et al. | |
| 7,102,104 B2 * | 9/2006 | Saito et al. | 219/390 |
| 2002/0121242 A1 | 9/2002 | Minami et al. | |
| 2003/0060030 A1 | 3/2003 | Lee et al. | |

FOREIGN PATENT DOCUMENTS

| | | |
|---|---|---|
| JP | 61-92050 | 6/1986 |
| JP | 61-241916 | 10/1986 |
| JP | 61241916 | 10/1986 |
| JP | 03-047531 | 2/1991 |
| JP | 03-288426 | 12/1991 |
| JP | 05-029448 | 2/1993 |
| JP | 05-243365 | 9/1993 |
| JP | 11-260743 | 9/1999 |
| JP | 2000-100812 | 4/2000 |
| JP | 2001-176810 | 6/2001 |
| JP | 2002-203846 | 7/2002 |
| JP | 2002-373890 | 12/2002 |
| TW | 459339 | 10/2001 |
| TW | 476983 | 2/2002 |
| TW | 495813 | 7/2002 |
| TW | 501164 | 9/2002 |
| TW | 518639 | 1/2003 |

OTHER PUBLICATIONS

Translation of PCT International Preliminary Report on Patentability (Form PCT/IPEA/409), dated Jan. 2004.
From corresponding European application, European Patent Office, Supplementary Partial European Search Report dated Aug. 30, 2007.
Supplementary European Search Report.

* cited by examiner

THERMAL PROCESSING METHOD AND THERMAL PROCESSING UNIT

FIELD OF THE INVENTION

This invention relates to a thermal processing method and a thermal processing unit for conducting a thermal process to an object to be processed.

BACKGROUND ART

In order to manufacture a desired semiconductor unit, various thermal processes including an oxidation process, a diffusion process, a CVD process, an annealing process or the like are carried out to an object to be processed such as a semiconductor wafer. As a thermal processing unit for conducting the processes, a vertical thermal processing unit is used wherein a large number of wafers are thermally processed at a time.

The vertical thermal processing unit has a processing container made of quartz, which forms a vertical thermal processing furnace. A furnace opening that opens at a lower end of the processing container can be opened and closed by a lid. A boat (holding tool) made of quartz that holds a large number of wafers in a tier-like manner is supported on the lid via a heat insulating cylinder made of quartz. In addition, around the processing container, a heater is arranged, which consists of a cylindrical heat insulating material and a heating resistance wire shaped into a spiral or the like provided in the cylindrical heat insulating material.

This type of conventional thermal processing unit is designed in such a manner that a thermal process is conducted in a relatively high temperature zone of, for example, about 900° C. to 1200° C. In addition, in this type of conventional thermal processing unit, after the thermal process, it is difficult for the temperature of the wafer to be lowered. Thus, in order to lower the temperature of the wafer, a structure that blows a cooling wind at an outside of the processing container has been proposed (for example, JP Laid-Open Publication No. 2000-100812).

Herein, as a thermal processing step, not in the high temperature zone, the wafer may be thermally processed in a relatively low temperature zone of, for example, about 50° C. to 600° C. For example, in order to reduce wire capacitance, if an organic film such as a resin having a small dielectric constant is used as an interlayer insulating film, the organic film may have to be hardened (vitrified) in a low temperature of about 40° C. to 600° C. It is possible to conduct a thermal process of a low temperature zone in a thermal processing unit designed for a high temperature.

However, in the conventional thermal processing unit, the processing container is made of quartz, and thus thermal capacity thereof is so large. In addition, the insulating material of the heater surrounds the processing container. Thus, even if the wafer is processed in a low temperature, it takes a long time to lower the wafer temperature to a handling temperature such as a room temperature. For example, when the wafer is naturally cooled to a room temperature after a thermal process, the temperature-fall rate (cooling speed) was less than 1° C./min, which is low. That is, the temperature-fall property of the wafer in a low temperature zone was inferior. This phenomenon was not improved so much by means of a unit that blows a cooling wind at a side wall of the processing container.

SUMMARY OF THE INVENTION

This invention is intended to solve the above problems. The object of this invention is to provide a thermal processing method and a thermal processing unit wherein temperature-fall property in a low temperature zone is improved so that throughput is improved.

This invention is a thermal processing method comprising: a step of conducting a predetermined thermal process in a low temperature zone to a plurality of objects to be processed held in a tier-like manner by a heating unit, in a processing container that is made of metal and has the heating unit therein; and a step of introducing a cooling gas into respective areas in the processing container divided in a height direction of the objects to be processed, after the thermal process is completed.

According to the feature, after the thermal process is completed, since a large amount of cooling gas is introduced dispersedly into the respective areas in the processing container divided in a height direction, the objects to be processed can be rapidly and uniformly cooled. Thus, the temperature-fall property in a low temperature zone may be improved, so that the throughput can be improved.

For example, the processing container may have a volume of about 170 liter. In the case, it is preferable that the step of introducing a cooling gas includes a step of introducing a cooling gas into the processing container at a flow rate of 300 to 500 liter/min.

In addition, the processing container may have a container-cooling unit in which a coolant flows. In the case, it is preferable that the step of introducing a cooling gas includes a step of operating the container-cooling unit so as to cool the objects to be processed to a temperature of 400° C. to 100° C. at a temperature-fall rate not less than about 40° C./min.

In addition, this invention is a thermal processing unit for conducting a thermal process to a plurality of objects to be processed held in a tier-like manner in a processing container: wherein the processing container is made of metal; and a heating unit that heats the objects to be processed, and a cooling-gas introducing unit having a plurality of blowing holes for introducing a cooling gas into respective areas in the processing container divided in a height direction of the objects to be processed, are provided in the processing container.

According to the feature, a large amount of cooling gas can be introduced dispersedly into the respective areas in the processing container divided in a height direction. Thus, the objects to be processed can be rapidly and uniformly cooled, and hence the temperature-fall property in a low temperature zone may be improved, so that the throughput can be improved.

Preferably, a circular space is formed between the processing container and the plurality of objects to be processed held in a tier-like manner, the cooling-gas introducing unit is a cooling-gas introducing pipe arranged in the circular space and extending in a vertical direction, the plurality of blowing holes is formed at suitable intervals in the vertical direction of the cooling-gas introducing pipe, and each blowing hole is formed at a pipe wall of the cooling-gas introducing pipe in order to blow out the cooling gas in a tangential direction of the circular space.

In the case, nevertheless the thermal processing unit has relatively simple structure; a large amount of cooling gas can be introduced dispersedly into the respective areas in the processing container divided in a height direction, so that the objects to be processed can be rapidly and uniformly cooled.

In addition, it is preferable that a plurality of cooling-gas introducing pipes is arranged at suitable intervals in a circumferential direction of the circular space. In the case, a larger amount of cooling gas can be introduced in the processing container, so that the objects to be processed can be cooled more rapidly.

In addition, in order to efficiently disperse the cooling gas into the respective areas in the processing container divided in a height direction, it is preferable that the plurality of cooling-gas introducing pipes has different lengths in the vertical direction. In the case, the cooling gas can be introduced more uniformly into the respective areas in the processing container divided in a height direction.

In addition, preferably, the blowing hole is provided with a porous member. In the case, the flow of the cooling gas may be effectively dispersed, and the flow rate may be reduced. Thus, particle scattering can be inhibited.

For example, the processing container has a volume of about 170 liter. In the case, preferably, the cooling-gas introducing unit is capable of introducing a cooling gas into the processing container at a flow rate of 300 to 500 liter/min.

In addition, it is preferable that the processing container has a container-cooling unit in which a coolant flows.

In the case, it is preferable that the cooling-gas introducing unit and the container-cooling unit are capable of cooling the objects to be processed to a temperature of 400° C. to 100° C. at a temperature-fall rate not less than about 40° C./min.

DESCRIPTION OF THE PREFERRED EMBODIMENT

Figure 1:
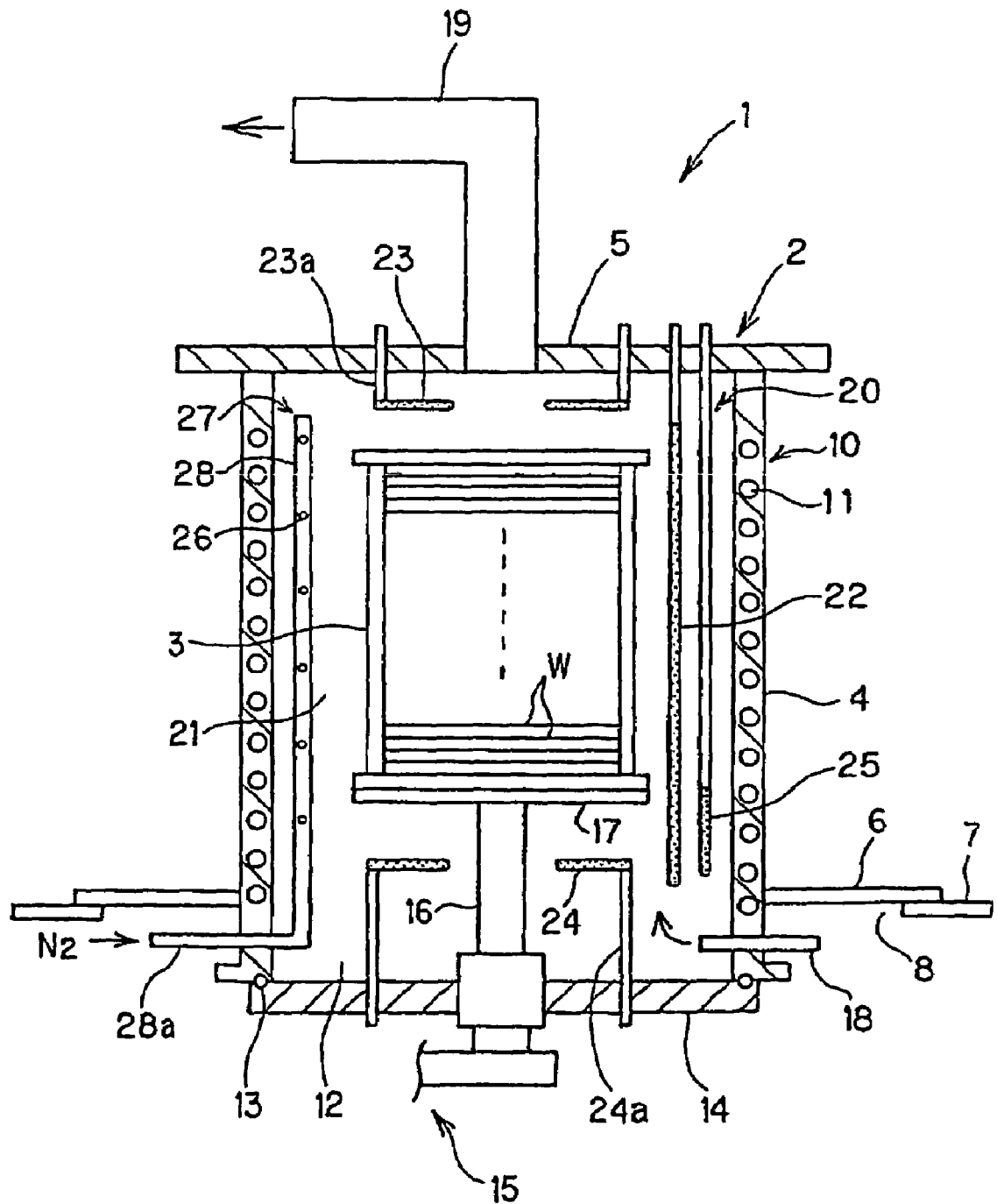
FIG. 1 is a longitudinal sectional view showing a thermal processing unit of an embodiment according to the present invention.
Figure 2:
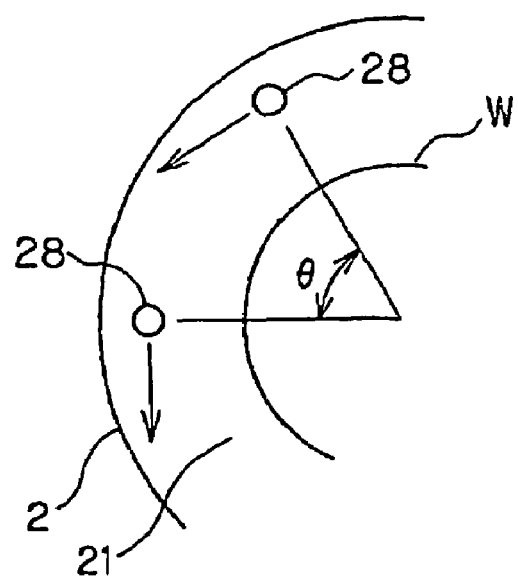
FIG. 2 is a schematic transversal sectional view showing an example of arrangement of cooling-gas blowing-out pipes in a processing container.
Figure 3:
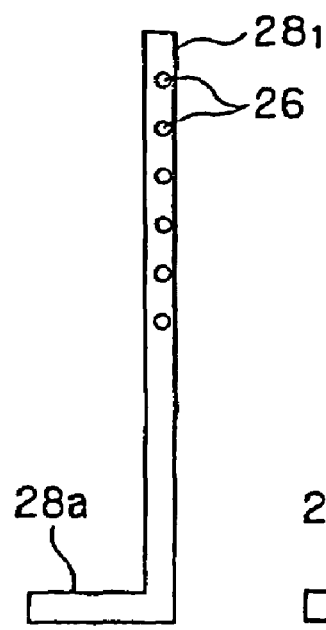
FIG. 3 is a view for explaining an example of combination of cooling-gas blowing-out pipes.
Figure 3:
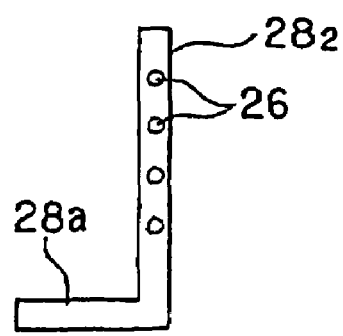
Figure 4A:
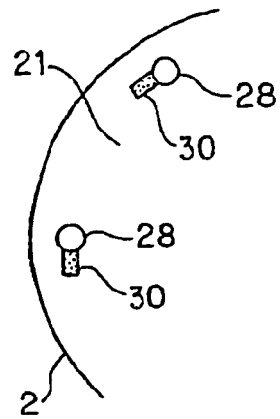
FIGS. 4A to 4C are views showing another embodiment of cooling-gas blowing-out pipes, FIG. 4A being a schematic transversal sectional view showing an example of arrangement of the cooling-gas blowing-out pipes in a processing container, FIG. 4B being a side view of the cooling-gas blowing-out pipe, FIG. 4C being a partial enlarged sectional view showing a main part of FIG. 4B.
Figure 4B:
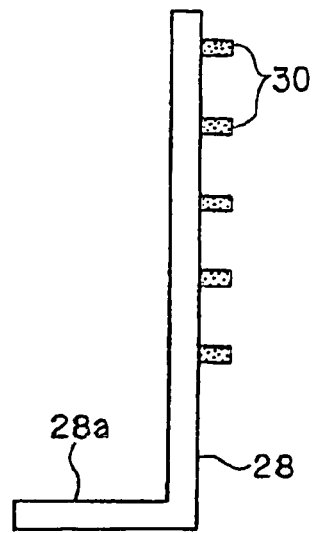
Figure 4C:
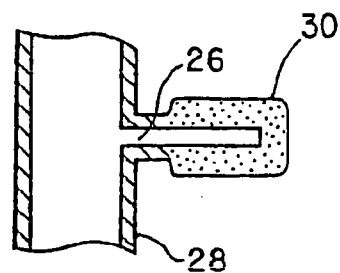
Figure 5:
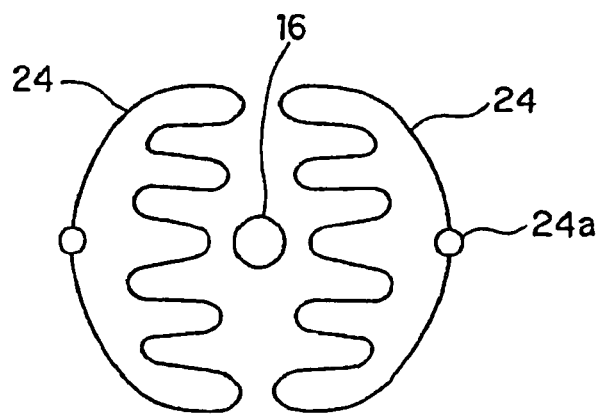
FIG. 5 is a schematic plan view showing an example of lower heater in a processing container.
Figure 6:
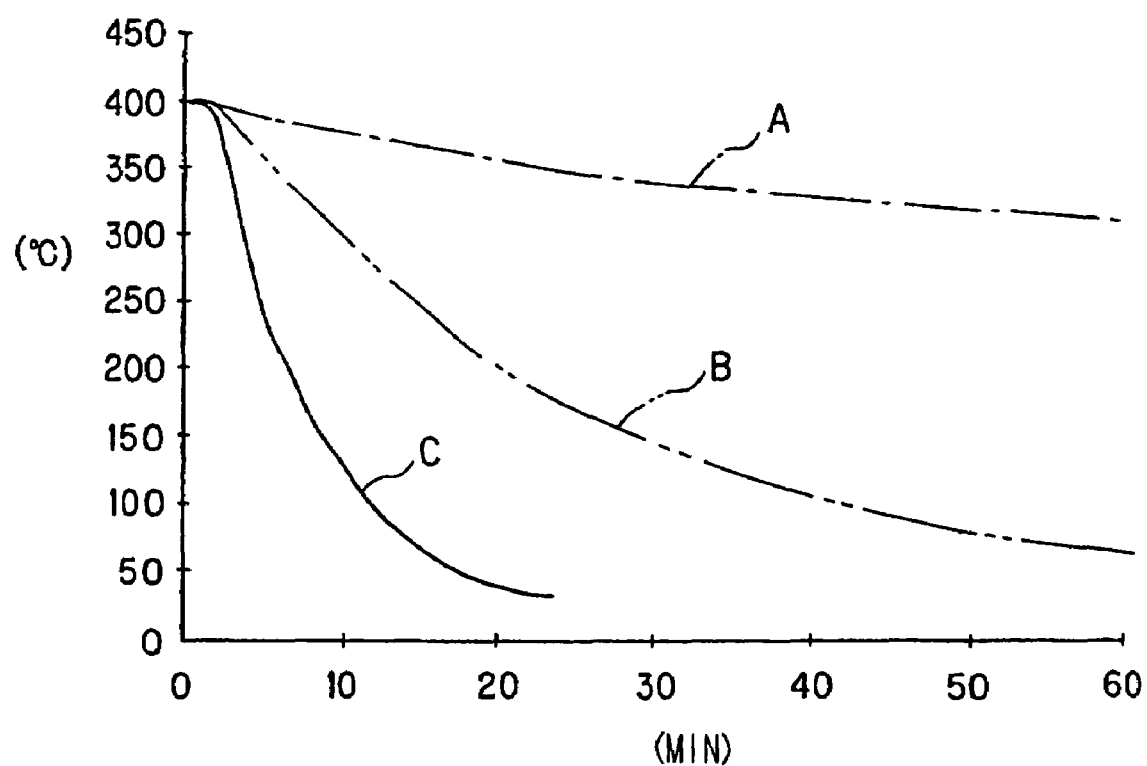
FIG. 6 is a graph showing a comparison result of a temperature-fall rate of a wafer between an embodiment unit and a conventional unit.

Hereinafter, embodiments of the present invention are explained in detail with reference to the attached drawings. FIG. 1 is a longitudinal sectional view showing a thermal processing unit of an embodiment according to the present invention. FIG. 2 is a schematic transversal sectional view showing an example of arrangement of cooling-gas blowing-out pipes in a processing container. FIG. 3 is a view for explaining an example of combination of cooling-gas blowing-out pipes. FIGS. 4A to 4C are views showing another embodiment of cooling-gas blowing-out pipes. FIG. 4A is a schematic transversal sectional view showing an example of arrangement of the cooling-gas blowing-out pipes in a processing container. FIG. 4B is a side view of the cooling-gas blowing-out pipe. FIG. 4C being a partial enlarged sectional view showing a main part of FIG. 4B. FIG. 5 is a schematic plan view showing an example of lower heater in a processing container. FIG. 6 is a graph showing a comparison result of a temperature-fall rate of a wafer between an embodiment unit and a conventional unit.

As shown in FIG. 1, the thermal processing unit 1 has a processing container 2 that forms a vertical thermal processing furnace for conducting a predetermined thermal process to a plurality of, for example about 25 to 50, objects to be processed such as semiconductor wafers w held in a tier-like manner. As a unit that holds the wafers w in a tier-like manner (object-to-be-processed holding tool), a boat 3 made of quartz is used, which holds the wafers w having a diameter of, for example, 300 mm in a tier-like manner in a vertical direction at predetermined intervals.

The processing container 2 is made of a metal that has good heat resistance, good corrosion resistance, and smaller thermal capacity than that of quartz and that is unlikely to become metallic contaminant for the wafers w, such as stainless steel or aluminum whose surface is anodized (alumite). The processing container 2 is formed into a cylindrical shape whose lower end is opened. The processing container 2 of the present embodiment mainly consists of a cylindrical body part 4 forming a side wall, and a ceiling part (ceiling plate) 5 hermetically fixed to an upper open end of the body part 4. The body part 4 and the ceiling part 5 may be formed in integral. A flange-shaped supporting member 6 is attached on the body part 4. An outside end portion of the supporting member 6 is fixed to an upper surface of a peripheral part of an opening 8 of a base plate 7, so that the processing container 2 is installed on the base plate 7.

The processing container 2 is provided with a container-cooling unit 10 that cools the processing container 2 itself by causing a coolant to flow therein. As a container-cooling unit 10, a water-cooling jacket may be provided on an outside surface of the processing container 2. However, it is preferable that a coolant passage 11 for causing a coolant, such as cooling water of a room temperature, to flow therein is provided in the processing container 2 in terms of structural simplification and improvement of cooling property. In the present embodiment, the coolant passage 11 is spirally provided at the body part 4 of the processing container 2. A coolant circulating system for causing the coolant to flow is connected to the coolant passage 11. It is preferable that the coolant circulating system can control the processing container 2 to a predetermined temperature in such a manner that components of a process gas are not deposited. In addition, another coolant passage may be provided in the ceiling part 5 of the processing container 2.

Under the processing container 2, a lid 14 that comes in contact with an open end of the furnace opening 12 (a lower opening of the processing container 2) hermetically via a sealing member such as an O-ring 13 in order to hermetically seal the furnace opening 12 is provided in a vertically movable manner by means of a elevating mechanism 15. The lid 14 is also made of the same material as the processing container 2. Another coolant passage may be provided in the lid 14.

In order to support the boat 3 in a rotatable manner at a predetermined thermal processing area in the processing container 2, a rotation table 17 that can rotate at a predetermined height is provided on the lid 14 via a rotatable column 16. The boat 3 is placed on the rotation table 17 in a removable manner. Under the lid 14, a driving mechanism (not shown) that pierces a center portion of the lid 14 and causes the rotatable column 16 to rotate is provided. A gas introducing pipe 18 for introducing a predetermined process gas into the processing container 2 is provided at a lower part of the processing container 2, for example at a lower portion of the side wall. At an upper part (the ceiling part) of the processing container 2, a gas-discharging pipe 19 for discharging atmospheric gas in the processing container 2 is provided. A gas source is connected to the gas introducing pipe 18. A pressure-reducing gas-discharging system having: a pressure-reducing pump that can discharge gas in the processing container 2 and reduce the pressure of the processing container 2; a pressure controlling mechanism; or the like is connected to the gas-discharging pipe 19. The thermal processing unit 1 of the present embodiment is adapted to control the pressure in the processing container 2 to a pressure of, for example, 0.1 Torr (13.33 Pa) (reduced pressure) to 760 Torr (101 kPa) (normal pressure), preferably 650 Torr (86.6 kPa) (minutely reduced pressure), in order to conduct a thermal process. Herein, the process gas may be introduced from an upper part of the processing container 2 and discharged out from a lower part thereof.

In the processing container 2, a heating unit (heater) 20 for heating the wafers w in a low temperature zone of, for example, about 40° C. to 600° C. is provided. As a heating unit 20, since it is arranged in the processing container 2, for example, a tubular heater in which a carbon wire is inserted and sealed in a quartz tube may be used, in order not to generate metallic contaminant for the wafers w. In addition, the heating unit 20 of the present embodiment consists of: a side heater 22 arranged in a circular space between the boat 3 and the side wall of the processing container 2; a ceiling heater 23 arranged above the boat 3; and a bottom heater 24 arranged under the boat 3.

The side heater 22 is formed by bending a tubular heater into a U-shape. A base part of the side heater 22 hermetically pierces the ceiling part 5 of the processing container 2, and hence is held by the ceiling part 5. Then, the side heater 22 droops from the ceiling part 5 to a low position in the circular space 21. Such side heaters 22 are arranged at substantially the same intervals in a circumferential direction of the circular space 21. In addition, a bottom assistance heater 25 consisting of a tubular heater that has a U-shape as a whole but has a tip portion bent in an up-and-down meander may be provided in order to heat a bottom area in the processing container 2. It is preferable that such bottom assistance heaters 25 are arranged at substantially the same intervals in a circumferential direction of the circular space 21, in the same manner as the side heaters 22.

The ceiling heater 23 is mounted at the ceiling part 5 so as to face an upper surface of the boat 3. The bottom heater 24 is mounted at the lid 14 so as to face a lower surface of the rotation table 17. A column part 23a supporting the ceiling heater 23 and including wires for the ceiling heater 23 hermetically pierces the ceiling part 5, and hence is held by the ceiling part 5. A column part 24a supporting the bottom heater 24 and including wires for the bottom heater 24 hermetically pierces the lid 14, and hence is held by the lid 14. The ceiling heater 23 and the bottom heater 24 may be sheet heaters. Alternatively, for example as shown in FIG. 5, a plurality of, for example two or three, symmetrical combinations of tubular heaters bent in a horizontal meander may be arranged. When the ceiling heater 23 and the bottom heater 24 are provided, temperatures of the wafers w held in a tier-like manner by the boat 3 may be made more uniform within each surface and between surfaces.

On the other hand, correspondingly to the wafers w held in a tier-like manner in the processing container 2, a cooling-gas introducing unit 27 is provided, which has a plurality of blowing-out holes 26 that blow out a cooling gas, such as a nitrogen ($N_2$) gas of a room temperature, into respective areas divided in a height direction. The cooling-gas introducing unit 27 of the present embodiment consists of a cooling-gas introducing pipe 28 made of quartz, which is arranged in a vertical direction in the circular space 21 between the side wall 4 of the processing container 2 and the wafers w held in the processing container 2. A base part 28a of the cooling-gas introducing pipe 28 is bent into an L-shape, pierces a lower portion of the side wall of the processing container 2 hermetically and horizontally, and is held by the side wall. The base part 28a of the cooling-gas introducing pipe 28 is connected to a cooling-gas source.

The cooling-gas introducing pipe 28 stands up along the side wall of the processing container 2 vertically. An upper end portion of the cooling-gas introducing pipe 28 is closed and supported by a supporting member (not shown) to an upper part of the side wall 4 or the ceiling part 5. The plurality of blowing-out holes 26 having a diameter of about 5 mm is formed at suitable intervals in a longitudinal direction at the pipe wall of the cooling-gas introducing pipe 28, in order to blow out the cooling gas in a tangential direction of the circular space 21. When the cooling gas is blown out in the tangential direction in order not to directly come in contact with the wafers w, local cooling of the wafers w and scattering of particles can be prevented. In addition, when the cooling gas is blown out in the tangential direction, a stewing flow of the cooling gas may be generated in the processing container 2. Thus, the wafers w can be cooled more effectively, uniformly within a surface and uniformly between surfaces.

In addition, in order to introduce the cooling gas into the processing container 2 whose volume is about 170 liter at a high flow rate (for example, 300 to 500 liter/min), it is preferable that the cooling-gas introducing pipes 28 are arranged at suitable intervals in a circumferential direction of the circular space 21. In the present embodiment, as shown in FIG. 2, two cooling-gas introducing pipes 28, 28 are arranged at a predetermined central angle $\theta$ (for example, $\theta=60°$). In the case, it is preferable that the plurality of cooling-gas introducing pipes 28 have different lengths, as shown in FIG. 3, in order to introduce the cooling gas into the processing container 2 uniformly in a height direction. In the example shown in FIG. 3, in order to uniformly introduce the cooling gas into the two areas in a height direction in the processing container 2, two cooling-gas introducing pipes $28_1$, $28_2$ of different lengths are provided.

In addition, as shown in FIGS. 4A to 4C, it is preferable that a porous member 30 is provided in the blow-out hole 26, in order to reduce the flow rate of the cooling gas blown out from the blow-out hole 26 and inhibit the scattering of particles. The porous member 30 may be a silica porous layer, which may be formed by sintering silica powders. Thus, even if the flow amount (rate) of the cooling gas is increased, the flow of the cooling gas can be dispersed, and the flow rate can be reduced, so that the scattering of particles can be inhibited.

Next, an operation of the thermal processing unit 1 having the above structure is explained. At first, the lid 14 in an unload state is moved up, and the boat 3 holding the plurality of wafers w is loaded into the processing container 2. The lid 14 hermetically closes the furnace opening 12 of the processing container 2. Then, the pressure in the processing container 2 is reduced, and adjusted to a predetermined process pressure. In addition, electric power supplied to the heating unit (heater) 20 is increased, so that the wafers w are heated to a predetermined process temperature. Furthermore, a predetermined process gas is introduced from the gas introducing pipe 18 into the processing container 2, so that a predetermined thermal process in a low temperature zone is conducted. During the thermal process, the rotation table 17 rotates, and a coolant such as a cooling water of a room temperature is caused to flow in the coolant passage 11 provided at the side wall 4 of the processing container 2, so as to cool or control the side wall 4 to a predetermined temperature. Alternatively, the cooling water may not be caused to flow, in order to raise thermal efficiency.

After the thermal process of a predetermined time is completed, the electric power supplied to the heating unit (heater) 20 is reduced or stopped, and a forcible cooling operation of the wafers is conduced. When the coolant is caused to flow in the coolant passage 11 of the side wall 4 of the processing container 2 during the thermal process, the coolant is caused to flow after the thermal process as well, in order to continue the cooling of the side wall 4. At the same time, a cooling gas such as an $N_2$ gas of a room temperature is supplied into the cooling-gas introducing pipes 28 as the cooling-gas introducing unit 27, and the cooling gas is introduced into the processing container 2 through the plurality of blow-out holes 26 at the pipe walls of the cooling-gas introducing pipes 28. Thus, the wafers w are cooled. In addition, it is preferable that the blow-out direction of the cooling gas is the same as the rotating direction of the rotation table 17.

As described above, according to the thermal processing unit 1 of the present embodiment, the thermal capacity of the processing container made of a metal is small, and the processing container 2 is directly cooled by the coolant flowing in the coolant passage 11. Thus, the thermal processing unit is superior in temperature responsiveness in a low temperature zone, that is, superior in thermal processing property in a low temperature zone. In addition, the cooling gas is introduced into the processing container 2 from a plurality of positions in a height direction by the cooling-gas introducing pipes 28 as the cooling-gas introducing unit 27. Thus, a large amount of cooling gas can be introduced uniformly in a height direction of the processing container 2, so that the wafers w held in a tier-like manner by the boat 3 in the processing container 2 can be cooled rapidly and uniformly. Specifically, the present embodiment is superior in temperature-fall property in a low temperature zone, for example of 400° C. to a room temperature. That is, after the thermal process, the wafer temperature can be lowered rapidly, so that the throughput can be improved.

The forcible cooling operation of the wafers is conducted while the atmospheric gas in the processing container 2 is discharged from the gas-discharging pipe 19. That is, the gas in the processing container 2 is replaced with the $N_2$ gas as the cooling gas. After the forcible cooling operation is conducted for a predetermined time so as to cool the wafers w to a room temperature, gas-discharging and supply of the cooling gas are stopped in turn, and the pressure in the processing container 2 is returned to a normal pressure. After that, the lid 14 is opened, and the boat 3 is unloaded.

FIG. 6 is a graph showing a comparison result of a temperature-fall rate of a wafer between the present embodiment and a conventional unit (wherein the processing container is made of quartz). Herein, the measurement of the temperature-fall rate was conducted by, means of thermocouples, for a central portion and a peripheral portion of each of wafers, located at an upper portion, a middle portion and a lower portion of the boat 3. In the case of the conventional thermal processing unit, it took 480 minutes to lower the temperature from 400° C. to 100° C., which corresponds to a temperature-fall rate less than 1° C./min, which is very low, as shown by a curve A having a very gentle gradient. To the contrary, a temperature-fall rate of the thermal processing unit of the present embodiment for 20 minutes from the measurement start was about 10° C./min, which is high, as shown by a curve B having a certain gradient, wherein introduction of the cooling gas and cooling of the processing container were not conducted, that is, the cooling was conducted naturally. In addition, when introduction of the cooling gas and cooling of the processing container were conducted, that is, a forcible cooling operation was conducted, a temperature-fall rate for 10 minutes from the measurement start was about 40° C./min, which is very high, as shown by a curve C having a great gradient. Herein, during the temperature-fall, temperature difference between surfaces of the wafers and temperature difference within each wafer surface were about ±3° C., that is, good soaking property could be obtained.

The embodiment of the present invention has been explained in detail with reference to the attached drawings. However, the present invention is not limited to the above embodiment, but may be variously modified in design within a scope of the summary of the invention. For example, as a cooling-gas introducing unit, blow-out holes for a cooling gas may be formed at the side wall of the processing container, and the cooling gas may be introduced into the processing container from the side wall. The object to be processed is not limited to the semiconductor wafer, but may be a glass substrate, an LCD substrate, or the like. As a cooling gas, an inert gas such as $N_2$ is preferable in order to prevent formation of a natural oxide film on a wafer.

The invention claimed is:

1. A thermal processing unit for conducting a thermal process to a plurality of objects to be processed held in a tier-like manner in a processing container, wherein
    the processing container is cylindrically shaped and made of metal,
    a heating unit that heats the objects to be processed, and a cooling-gas introducing unit having a plurality of blowing holes for introducing a cooling gas into respective areas in the processing container divided in a height direction of the objects to be processed, are provided in the processing container,
    a circular space is formed between the processing container and the plurality of objects to be processed held in a tier-like manner,
    the cooling-gas introducing unit is a plurality of cooling-gas introducing pipes arranged at intervals in a circumferential direction of the circular space and extending in the height direction, the plurality of cooling-gas pipes having different lengths in the height direction,
    the plurality of blowing holes is formed at intervals in a longitudinal direction of each cooling-gas introducing pipe for blowing a slewing flow of the cooling gas in a tangential direction of the circular space, and
    each blowing hole is formed at a pipe wall of the cooling-gas introducing pipe to face in the same tangential direction of the processing container such that each blowing hole blows out the cooling gas in the tangential direction of the circular space, the plurality of blowing holes for uniformly cooling said objects.

2. A thermal processing unit according to claim 1, wherein the processing container has a volume of about 170liter, and
    the cooling-gas introducing unit is capable of introducing a cooling gas into the processing container at a flow rate of 300 to 500 liter / mm.

3. A thermal processing unit according to claim 1, wherein the processing container has a container-cooling unit provided therein having a spirally provided coolant passage in which a coolant flows.

4. A thermal processing unit according to claim 3, wherein the cooling-gas introducing unit and the container-cooling unit are capable of cooling the objects to be processed to a temperature of 400° C. to 100° C. at a temperature-fall rate not less than about 40° C./min.

5. A thermal processing unit for conducting a thermal process to a plurality of objects to be processed held in a tier-like manner in a processing container, wherein the processing container is cylindrically shaped and made of metal, a heating unit that heats the objects to be processed, and a cooling-gas introducing unit having a plurality of blowing holes for introducing a cooling gas into respective areas in the processing container divided in a height direction of the objects to be processed, are provided in the processing container, and each blowing hole is provided with a porous member;

wherein the cooling-gas introducing unit is a plurality of cooling-gas introducing pipes arranged at intervals in a circumferential direction of a circular space of the processing container and extending vertically along a side wall of the processing container, each cooling-gas introducing pipe comprising a plurality of blowing holes arranged in the height direction above one another along the pipe, the circular space being formed between the processing container and the plurality of objects to be processed held in a tier-like manner, the plurality of blowing holes for blowing a slewing flow of the cooling gas in a tangential direction of the circular space to uniformly cool said objects and wherein each blowing hole is formed at a pipe wall of the cooling-gas introducing pipe to face in the same tangential direction of the processing container such that each blowing hole blows out the cooling gas in said tangential direction of the circular space, the cooling gas not coming directly into contact with said objects.

6. A thermal processing unit according to claim 5, wherein the processing container has a volume of about 170liter, and the cooling-gas introducing unit is capable of introducing a cooling gas into the processing container at a flow rate of 300 to 500 liter/mm.

7. A thermal processing unit according claim 5, wherein the processing container has a container-cooling unit in which a coolant flows.

8. A thermal processing unit according to claim 7, wherein the cooling-gas introducing unit and the container-cooling unit are capable of cooling the objects to be processed to a temperature of 400° C. to 100° C. at a temperature-fall rate not less than about 40° C./mm.

9. A thermal processing unit according to claim 5, wherein the processing container has a container-cooling unit provided therein having a spirally provided coolant passage in which a coolant flows.

10. A thermal processing unit according to claim 5, said porous member comprising a silica porous layer.

* * * * *